(12) United States Patent
Maloney

(10) Patent No.: US 11,184,993 B2
(45) Date of Patent: Nov. 23, 2021

(54) FLOW PLATE

(71) Applicant: T-Mobile USA, Inc., Bellevue, WA (US)

(72) Inventor: Brian Maloney, Bellevue, WA (US)

(73) Assignee: T-Mobile USA, Inc., Bellevue, WA (US)

( * ) Notice: Subject to any disclaimer, the term of this patent is extended or adjusted under 35 U.S.C. 154(b) by 380 days.

(21) Appl. No.: 15/085,424

(22) Filed: Mar. 30, 2016

(65) Prior Publication Data

US 2017/0290196 A1  Oct. 5, 2017

(51) Int. Cl.
*H05K 7/20* (2006.01)

(52) U.S. Cl.
CPC ..... *H05K 7/20136* (2013.01); *H05K 7/20181* (2013.01)

(58) Field of Classification Search
CPC ............. H05K 7/20136; H05K 7/20181
USPC ........................................................ 454/184
See application file for complete search history.

(56) References Cited

U.S. PATENT DOCUMENTS

| | | | | |
|---|---|---|---|---|
| 4,073,384 A * | 2/1978 | Celeste | ............... | A47B 96/027 211/134 |
| 5,725,622 A * | 3/1998 | Whitson | ............... | B01D 46/00 361/695 |
| 6,164,369 A * | 12/2000 | Stoller | ............... | H05K 7/20572 165/104.33 |
| 8,462,496 B2 * | 6/2013 | Schmitt | ............... | G06F 1/20 165/104.33 |
| 8,767,399 B2 * | 7/2014 | Goto | ............... | H05K 7/20209 361/679.51 |
| 2004/0189159 A1 * | 9/2004 | James | ............... | A47B 57/16 312/257.1 |
| 2007/0254583 A1 * | 11/2007 | Germagian | ............... | H05K 7/20745 454/184 |
| 2008/0068798 A1 * | 3/2008 | Hendrix | ............... | H05K 7/206 361/696 |
| 2009/0241454 A1 * | 10/2009 | Yeh | ............... | E06B 7/082 52/473 |
| 2014/0015394 A1 * | 1/2014 | Cha | ............... | B23P 15/26 312/404 |
| 2014/0287671 A1 * | 9/2014 | Slessman | ............... | F28F 9/0265 454/184 |
| 2015/0201524 A1 * | 7/2015 | Davis | ............... | A47B 87/00 454/184 |
| 2017/0074568 A1 * | 3/2017 | Orozco | ............... | F25B 49/02 |

* cited by examiner

*Primary Examiner* — Allen R Schult
(74) *Attorney, Agent, or Firm* — Lee & Hayes, P.C.

(57) ABSTRACT

A system includes a cabinet having a first wall, a second wall opposite the first wall, and a back wall extending from the first wall to the second wall. The system also includes a flow plate disposed at least partially within the cabinet and partitioning the inner space into a first portion and a second portion. The system also includes a shelf disposed at least partially within the first portion of the inner space, and a flow device fluidly connected to the cabinet. The flow device is configured to remove air from the first portion of the inner space, and the flow plate is configured to substantially prohibit removal of air by the flow device from the second portion, via the first portion, when the cabinet is in a closed condition.

15 Claims, 7 Drawing Sheets

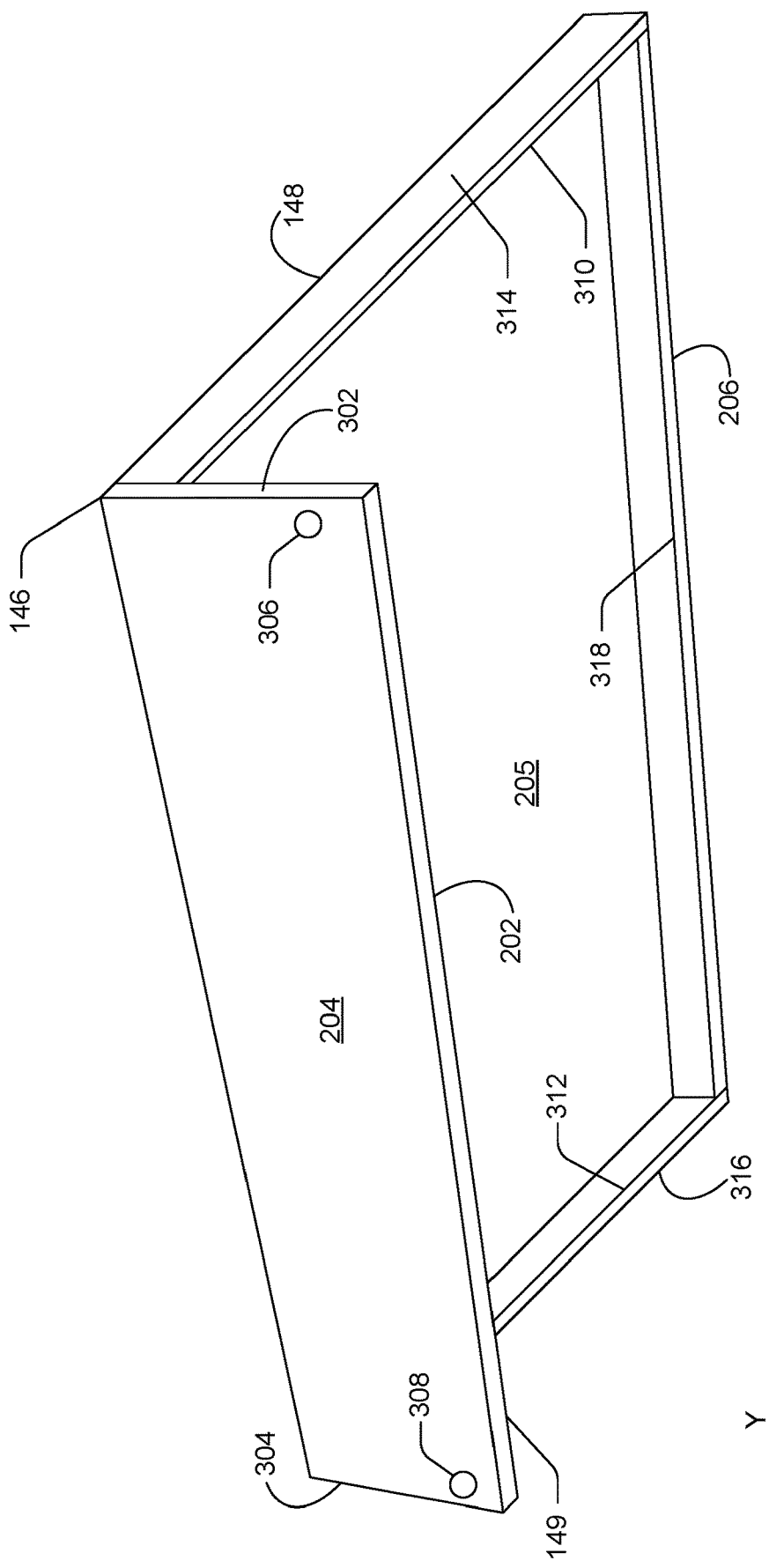

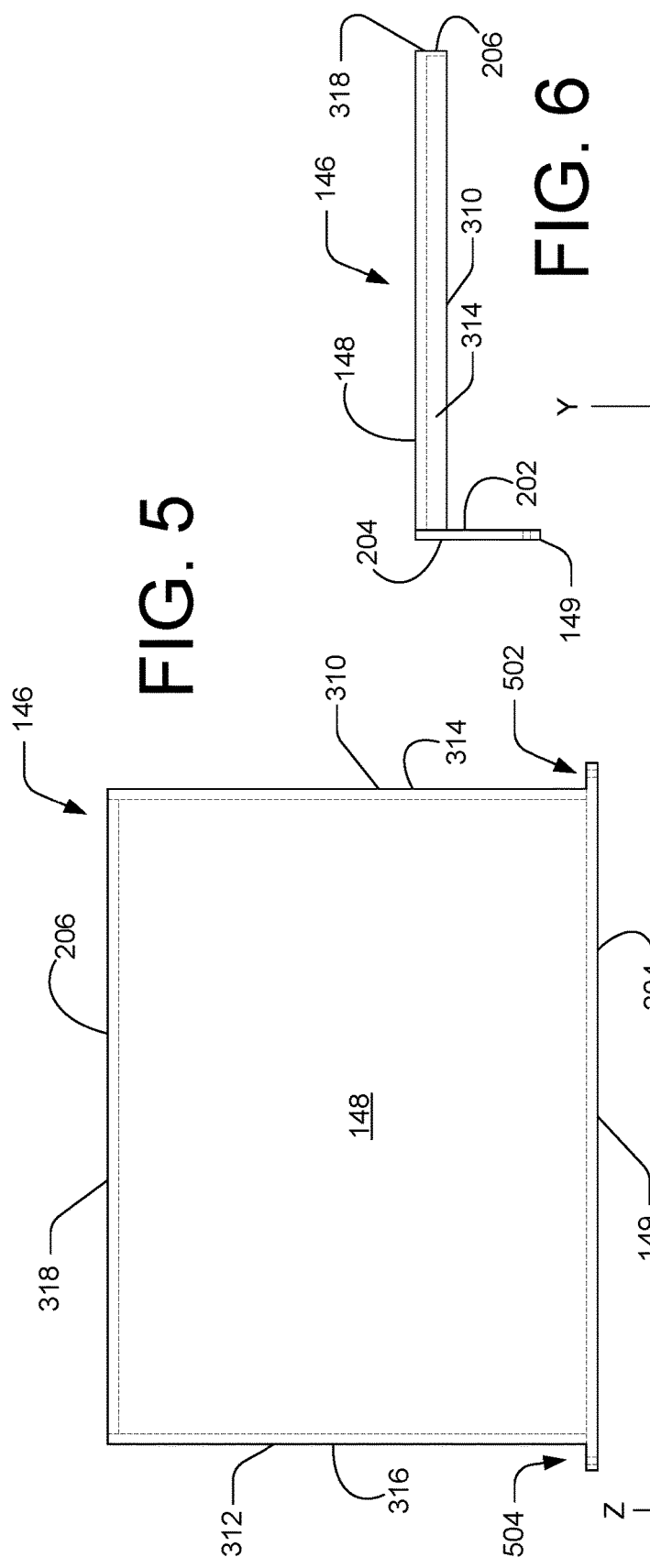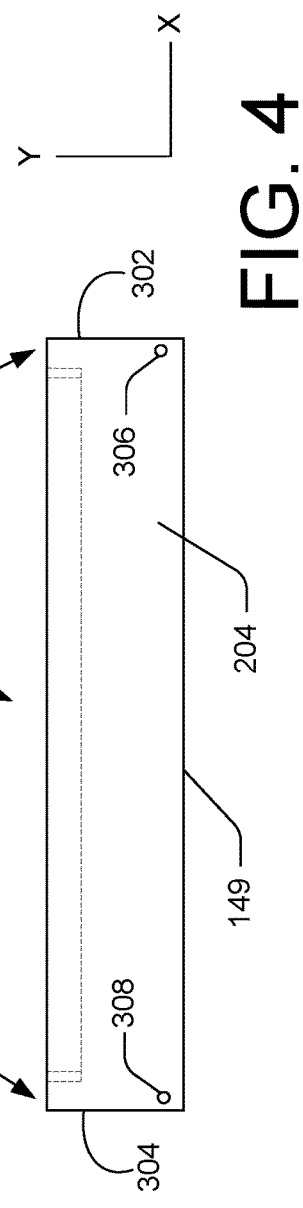

FLOW PLATE

BACKGROUND

Modern telecommunications networks, such as cellular telephone networks, often utilize a variety of electrical components such as telecommunication network devices, call control components, servers, routers, radio transmitters, DUWs, and other components. In some examples, such electrical components may be housed within one or more cabinets or other protective storage devices located at a base station. Such electrical components generally operate on a substantially continuous basis for extended periods of time, and as a result, such electrical components may generate a significant amount of heat while in use. Typically, however, such components must be maintained within a controlled temperature environment in order to operate at peak efficiency. For example, some electrical components operate at peak efficiency within a temperature window between approximately 40° C. and approximately 50° C. Additionally, some electrical components may be at risk of damage and/or failure when operating at temperatures above approximately 60° C.

In order to operate such electrical components within the above temperature window, the cabinets or other protective storage devices housing such electrical components are typically equipped with one or more fans or other flow devices configured to cycle air into and out of the cabinets. For example, each cabinet may be equipped with a flow device configured to remove air from the cabinet substantially continuously and/or at regular intervals. Removing air from the cabinet in this way may assist in extracting heat generated by the electrical components disposed within the cabinet and may assist in maintaining a temperature of the cabinet within an acceptable range. However, the internal configuration of some cabinets may not be optimized to facilitate effective airflow between the various electrical components housed therein. As a result, the flow devices associated with such cabinets may not be capable of maintaining the electrical components within the temperature window described above.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

FIG. 3 illustrates an isometric view of an example flow plate of the present disclosure.

FIG. 4 illustrates a front view of the example flow plate shown in FIG. 3.

FIG. 5 illustrates a top view of the example flow plate shown in FIG. 3.

FIG. 6 illustrates a side view of the example flow plate shown in FIG. 3.

DETAILED DESCRIPTION

Overview

Figure 1:
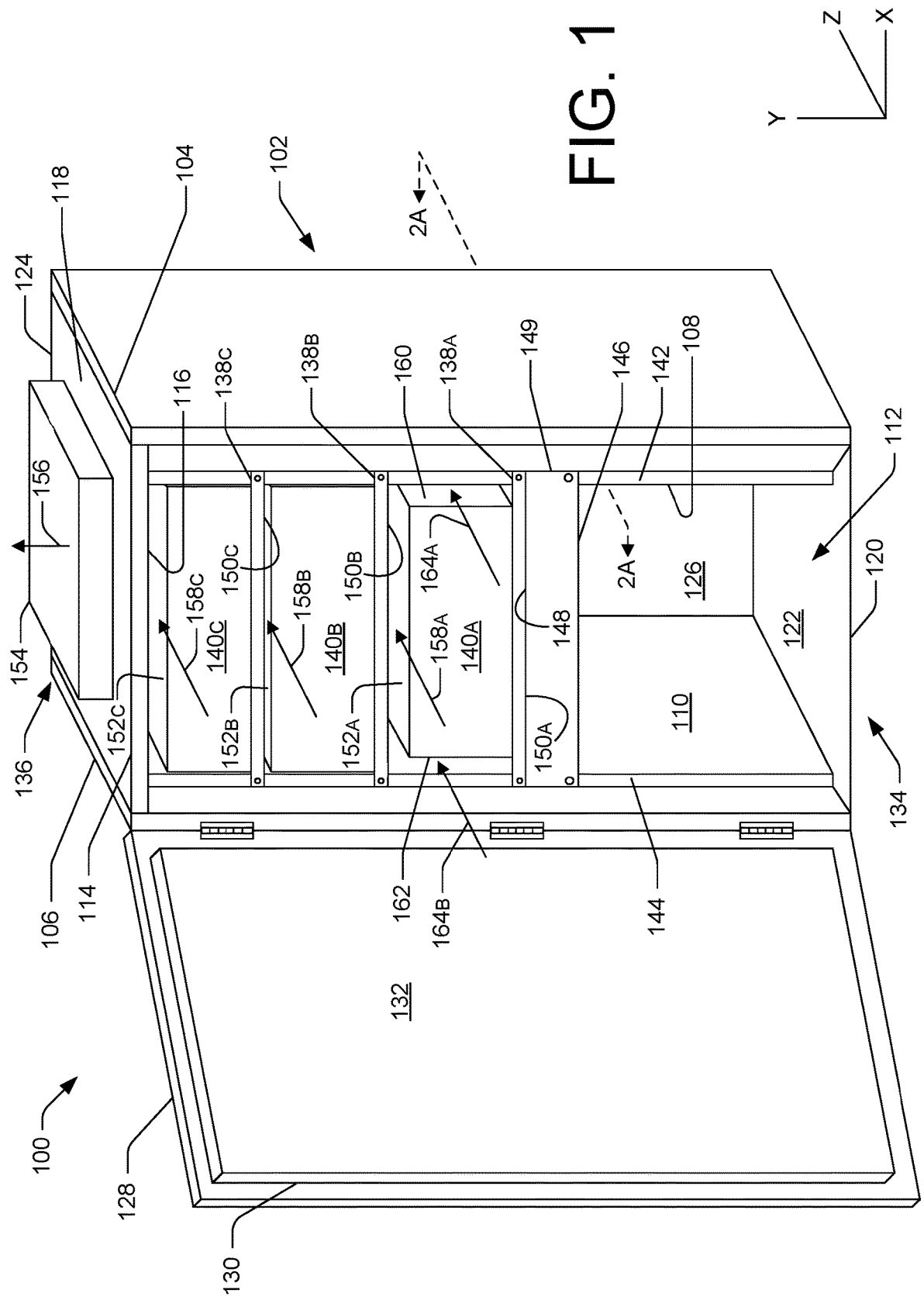
FIG. 1 illustrates an example system of the present disclosure including an example cabinet configured to store one or more electrical components.

This disclosure describes, in part, various methods and systems configured to maintain cabinets or other storage devices used to house electrical components within a desired temperature range. As a result, the various methods and systems described herein may ensure that such electrical components may operate at peak efficiency for extended periods of time, and without the risk of damage or failure. As will be described in greater detail below with respect to FIGS. 1-8, example systems of the present disclosure may include a cabinet or other storage device configured to house one or more electrical components, such as electrical components associated with a radio or telecommunications network. An example cabinet may include, among other things, a first wall, a second wall opposite the first wall, and a back wall extending from the first wall to the second wall. The first wall, the second wall, and the back wall may each include respective inner surfaces which, in combination, form at least part of an inner space of the cabinet within which the electrical components may be disposed. Such a cabinet may also include a top, a base, a door, and/or one or more additional components connected to at least one of the first wall, the second wall, and the back wall. Each such additional component may also include a respective inner surface forming at least an additional part of the inner space of the cabinet. In examples in which the cabinet includes a door, the door may be movably connected to one of the first wall, the second wall, the top, or the base. Alternatively, the door may be removably connected to the cabinet in any known way. The door may assist in, for example, transitioning the cabinet between an open condition in which the inner space of the cabinet is at least partially exposed, and a closed condition in which the inner space of the cabinet is enclosed by, for example, two or more of the door, the first wall, the second wall, the top, and the base of the cabinet.

Example systems of the present disclosure may also include at least one partition disposed within the inner space of the cabinet. Such a partition may be, for example, a flow plate disposed at least partially within the inner space. In some examples, such a flow plate may extend from the first wall to the second wall, and may be disposed substantially perpendicular to at least one of the first and second walls. Such a flow plate may also extend from, and may be disposed substantially perpendicular to, the back wall. In this way, the flow plate may partition the inner space of the cabinet into a first portion and a second portion. For example, the flow plate may include a top surface facing, for example, the top of the cabinet. The flow plate may also include a bottom surface facing, for example, the base of the cabinet. In such examples, the flow plate may partition the inner surface of the cabinet into a first portion at least partially defined by the top surface of the flow plate, and a second portion at least partially defined by the bottom surface of the flow plate.

Further, the flow plate may form a substantially fluid-tight seal with at least one of the first wall, the second wall, and the back wall. Such a substantially fluid-tight seal may be formed in any number of ways between the flow plate and such components of the cabinet. For example, various surfaces, panels, and/or other portions of the flow plate may be disposed adjacent to, substantially in contact with, and/or may otherwise abut corresponding surfaces of the first wall, the second wall, and/or the back wall. In such examples, the substantially fluid-tight seal described above may be formed via the at least partial contact between such portions of the flow plate and the corresponding surfaces of the cabinet. Alternatively, and/or in addition, the substantially fluid-tight seal may be formed via one or more of caulking, weldments, gaskets, O-rings, and/or other such means or connection devices. The flow plate may also include a front surface forming a substantially fluid-tight seal with at least a portion of the door when the cabinet is in a closed condition. As a result, the flow plate may be configured to substantially prohibit the movement of air and/or other like fluids between the first portion of the inner space and the second portion of the inner space when the cabinet is in the closed condition. In particular, when the cabinet is in the closed condition, the flow plate may substantially prohibit the removal of air and/or other like fluids from the second portion, via the first portion, when a vacuum or other such negative pressure is applied to, for example, the first portion of the inner space.

Example systems of the present disclosure may also include, among other things, a shelf disposed at least partially within the inner space. In examples in which the cabinet includes a flow plate partitioning the inner surface into a first portion and a second portion, the shelf may be disposed at least partially within the first portion of the inner space at least partially defined by the top surface of the flow plate. For example, the shelf and the flow plate may be positioned such that the top surface of the flow plate is disposed proximate, substantially adjacent to, and/or abutting a bottom surface of the shelf. In such examples, the distance between the top surface of the flow plate and the bottom surface of the shelf may be minimized in order to maximize the effectiveness of the flow plate and directing air between the various electrical components housed within the cabinet when air is removed from the first portion of the inner space. In such examples, the flow plate may substantially prohibit air disposed in the second portion from passing between the shelf and the inner surfaces of one or more of the first wall, the second wall, and the back wall of the cabinet.

In some example embodiments, the partition described above may comprise, for example, a shelf disposed at least partially within the inner space, and in such examples, the flow plate may be omitted. In such examples, the shelf may be configured to substantially prohibit the movement of air and/or other like fluids between the first portion of the inner space and the second portion of the inner space when the cabinet is in the closed condition. In particular, as described above with respect to the flow plate, when the cabinet is in the closed condition, the shelf may substantially prohibit the removal of air and/or other like fluids from the second portion, via the first portion, when a vacuum or other such negative pressure is applied to, for example, the first portion of the inner space. In such examples, the shelf may form a substantially fluid-tight seal with the first and second walls of the cabinet, and with the back wall. In such examples, the shelf may also form a substantially fluid-tight seal with at least a portion of the door when the cabinet is in the closed condition described above.

In any of the examples described herein, the system may also include one or more flow devices configured to assist in removing air from the inner space of the cabinet. For example, such flow devices may include one or more fans, pumps, and/or other devices configured to direct fluid flow. In such examples, a flow device may be fluidly connected to the cabinet and configured to remove air from the inner space in order to maintain a temperature within the cabinet at or below a desirable level. Such a desirable temperature level may be within, for example, a desired operating temperature range of the electrical components stored within the cabinet. In particular, the flow device may be configured to remove air from the first portion of the inner space while the cabinet is in a closed position. Additionally, as described above, in such embodiments the flow plate may be configured to substantially prohibit removal of air by the flow device from the second portion of the inner space, via the first portion, when the cabinet is in the closed condition. Thus, any air removed from the first portion may be forced to travel proximate and/or substantially along at least part of an outer surface of one or more of the electrical components. Directing air to travel in this way may maximize the efficiency with which the flow device may extract heat from the electrical components. In particular, because the partition, forms a substantially fluid-tight seal with the inner surfaces of the cabinet, substantially no air may be withdrawn from the second portion of the inner space, and/or from other portions of the inner space where resistance to such airflow is less than a corresponding resistance within the first portion of the inner space.

It is understood that as air is removed from the first portion of the inner space by the flow device, additional air may enter the first portion of the inner space via the door of the cabinet. For example, the door may include one or more vents, holes, and/or other openings configured to allow air from outside of the cabinet to enter the inner space of the cabinet when air is drawn out of the inner space by the flow device. Due to the substantially fluid-tight seals and/or other configurations of the flow plate and/or other partitions described above, however, substantially no air may pass from the second portion of the inner space into the first portion of the inner space even as air is drawn into the first portion by the flow device.

Examples of the embodiments described above will now be described with respect to FIGS. 1-8.

Example System

FIG. 1 illustrates an example system 100 of the present disclosure. As shown in FIG. 1, the system 100 may include, among other things, a cabinet 102 including a first wall 104 and the second wall 106 disposed opposite and/or substantially parallel to the first wall 104. The first and second walls 104, 106 may be substantially identical in shape, size, material composition, and/or other configurations. In some examples, at least one of the first wall 104 and the second wall 106 may be made from aluminum, tin, steel, and/or any other metals or alloys known in the art. In such examples, the materials utilized to manufacture at least one of the first wall 104 and the second wall 106 may be substantially non-magnetic. The first and second walls 104, 106 of the cabinet 102 may be oriented substantially vertically such as, for example, along the y-axis shown in FIG. 1. The first wall 104 may have an inner surface 108, and the second wall 106 have a corresponding inner surface 110 disposed opposite and/or substantially parallel to the inner surface 108 of the first wall 104. In some examples, at least one of the inner surfaces 108, 110 may be substantially planar. For example, the inner surface 108 of the first wall 104 may extend vertically along the y-axis in a first plane, and the inner surface 110 of the second wall 106 may extend vertically along the y-axis and a second plane substantially parallel to the first plane. At least one of the first wall 104 and the second wall 106 may define at least part of an inner space 112 of the cabinet 102. For example, at least one of the inner surfaces 108, 110 may form at least part of the inner space 112. In such examples, the inner surface 108 may form at least a first part of the inner space 112 and the inner surface 110 may form at least a second part of the inner space 112 different from the first part formed by the inner surface 108.

In some examples, the cabinet 102 may also include a top 114. The top 114 may be connected to at least one of the first wall 104 and the second wall 106. For example, the top 114 may be connected to the first and second walls 104, 106, and may extend from the first wall 104 to the second wall 106. The top 114 may have an inner surface 116 disposed substantially perpendicular to at least one of the first and second walls 104, 106 and/or substantially perpendicular to at least one of the inner surfaces 108, 110. In some examples, the inner surface 116 may be substantially planar. For example, the inner surface 116 of the top 114 may extend substantially horizontally along the x-axis shown in FIG. 1. Further, the top 114 may define at least part of the inner space 112 of the cabinet 102. For example, the inner surface 116 may form at least part of the inner space 112. The top 114 may also include an outer surface 118 disposed opposite the inner surface 116. The outer surface 118 may form, for example, at least part of an outer surface of the cabinet 102.

In some examples, the cabinet 102 may also include a base 120 disposed substantially parallel to the top 114. The base 120 may be configured to rest upon and/or otherwise support the cabinet 102 on top of a substantially horizontal floor, foundation, slab, mezzanine, and/or other support structure. The base 120 may be connected to at least one of the first wall 104 and the second wall 106. For example, the base 120 may be connected to the first and second walls 104, 106, and may extend from the first wall 104 to the second wall 106. The base 120 may have an inner surface 122 disposed substantially perpendicular to at least one of the first and second walls 104, 106 and/or substantially perpendicular to at least one of the inner surfaces 108, 110. Additionally, the base 120 and/or the inner surface 122 may be disposed substantially parallel to the top 114 and/or the inner surface 116 thereof. In some examples, the inner surface 122 of the base 120 may be substantially planar. For example, the inner surface 122 of the base 120 may extend substantially horizontally along the x-axis shown in FIG. 1. Further, the base 120 may define at least part of the inner space 112 of the cabinet 102. For example, the inner surface 122 may form at least part of the inner space 112.

In example embodiments, the cabinet 102 may also include a back wall 124 extending from the first wall 104 to the second wall 106. The back wall 124 may be oriented substantially vertically such as, for example, along the y-axis shown in FIG. 1. The back wall 124 may have an inner surface 126. In some examples, the inner surface 126 may be disposed substantially perpendicular to at least one of the inner surfaces 108, 110. Further, the inner surface 126 of the back wall 124 may be substantially planar. For example, the inner surface 126 of the back wall 124 may extend vertically along the y-axis in a first plane, and the first plane defined by the inner surface 126 may be substantially perpendicular to a plane defined by at least one of the inner surfaces 108, 110. Additionally, the back wall 124 and/or the inner surface 126 may be disposed substantially perpendicular to at least one of the base 120 and the top 114 of the cabinet 102. Further, the back wall 124 may define at least part of the inner space 112 of the cabinet 102. For example, the inner surface 126 may form at least part of the inner space 112.

As shown in FIG. 1, the cabinet 102 may also include a door 128. The door 128 may be configured to mate with at least one of the first wall 104 and the second wall 106. For example, the cabinet 102 may be transitioned between a closed condition and an open condition. In the closed condition, the inner space 112 may be substantially completely enclosed by two or more of the first and second walls 104, 106, the top 114, the base 120, the back wall 124, and the door 128. In such a closed condition, the door 128 may be in contact with, may be connected to, may be removably attached to, and/or may otherwise mate with at least the first and second walls 104, 106. In such a closed condition, the door 128 may also be in contact with, connected to, removably attached to, and/or mating with at least one of the top 114 and the base 120. In some examples, in the closed condition, the door 128 may form a substantially fluid-tight seal with at least one of the first wall 104, the second wall 106, the top 114, and the base 120. In the open condition, on the other hand, the inner space 112 may be at least partially exposed to a location outside of the cabinet 102. For example, in the open condition the door 128 may be at least partially separated from and/or may otherwise be at least partially disconnected from at least one of the first and second walls 104, 106. In such an open condition, the door 128 may also be at least partially separated from and/or may otherwise be at least partially disconnected from at least one of the top 114 and the base 120. The door 128 may be rotatably and/or otherwise connected to the cabinet 102 to facilitate transition in the cabinet 102 between the open condition and the closed condition. For example, the door 128 may be connected to the cabinet 102 by one or more hinges, latches, bolts, screws, and/or other connection structures configured to movably and/or removably connect the door 128 to the cabinet 102.

In some examples, the door 128 may be configured to permit air and/or other fluids to pass therethrough from a location outside of the cabinet 102, when the cabinet is in the closed condition, to a location within the inner space 112. Although not shown in FIG. 1, the door 128 may include one or more vents, thru holes, grates, orifices, channels, and/or other fluid passages to facilitate the passage of air and/or other fluids into the inner space 112. The door 128 may also include one or more filters 130 disposed proximate the inner space 112. In some examples, the filter 130 may extend along substantially an entire length of the door 128 and/or along substantially an entire width of the door 128 so as to minimize and/or substantially eliminate the passage of dust, dirt, and/or other airborne contaminants into the inner space 112 when the cabinet 102 is in the closed condition. Such filters 130 may include, for example, a mesh, honeycomb, and/or other type of particulate filter known in the art. Further, the door 128 may include an inner surface forming at least part of the inner space 112 of the cabinet 102. In some examples, the inner surface of the door 128 forming at least part of the inner space 112 may comprise an inner surface 132 of the filter 130. Alternatively, in embodiments in which the filter 130 has been omitted, such an inner surface may be, for example, a surface of the door 128. It is understood that in some examples, the door 128 and/or the filter 130 may permit passage of air and/or other fluids from a location outside of the cabinet 102 to any portion of the inner space 112 when the cabinet 102 is in the closed condition. In some examples, the door 128 may be connected to a front 134 of the cabinet 102, and the front 134 of the cabinet may be disposed opposite a back 136 of the cabinet 102 substantially defined by the back wall 124. In such examples, air and/or other fluids entering the inner space 112 via the door 128 may generally pass in a direction substantially along the z-axis shown in FIG. 1. Such a direction may, in general, be from the front 134 of the cabinet 102 to the back 136.

Example systems of the present disclosure may also include one or more partitions configured to separate, divide, and/or otherwise partition the inner space 112 into two or more portions. In some examples, the various portions of the inner space 112 formed by the one or more partitions of the present disclosure may comprise substantially fluidly separate compartments or portions of the inner space 112. In example embodiments, such partitions may comprise one or more shelves of the present disclosure. Additionally and/or alternatively, such partitions may comprise one or more flow plates of the present disclosure. For example, as shown in FIG. 1, the cabinet 102 may also include one or more shelves 138A, 138B, 138C . . . 138N, where "N" is any integer greater than or equal to one (collectively referred to herein as "shelves 138"). One or more of the shelves 138 may be, for example, disposed at least partially within the inner space 112. The shelves 138 may be supported by at least one of the first wall 104 and the second wall 106. For example, the shelves 138 substantially permanently connected or removably connected to at least one of the first wall 104 and the second wall 106.

The shelves 138 may be fixedly mounted within the cabinet 102 in order to support respective electrical components 140A, 140B, 140C . . . 140N (collectively referred to herein as "electrical components 140") thereon. In some examples, the shelves 138 may be connected to the first and second walls 104, 106, and each of the shelves 138 may extend substantially and/or entirely from the first wall 104 to the second wall 106. The shelves 138 may be substantially planar, and may be disposed substantially perpendicular to at least one of the first and second walls 104, 106 and/or substantially perpendicular to at least one of the inner surfaces 108, 110. For example, the shelves 138 may extend substantially horizontally along the x-axis and/or along the z-axis shown in FIG. 1. Additionally, the shelves 138 may be disposed substantially parallel to the top 114 and/or the inner surface 116 thereof. It is understood that the shelves 138 may be appropriately spaced in a vertical direction along the y-axis in order to accommodate respective electrical components 140 of varying heights, shapes, and/or other configurations. As will be described in greater detail below, in the example system 100 illustrated in FIGS. 1 and 1A, at least one of the shelves 138 may include a back surface facing the inner surface 126 of the back wall 124, and the back surface of the at least one of the shelves 138 may be spaced from the inner surface 126 in, for example, the direction of the z-axis.

With continued reference to FIG. 1, in some examples one or more of the partitions described herein may be connected to and/or otherwise supported by at least one of the inner surfaces 108, 110, 126. Additionally and/or alternatively, at least one of the partitions described herein may be connected to and/or otherwise supported by one or more additional portions of the first wall 104 and/or the second wall 106. For example, the first wall 104 may include a front surface 142, and the second wall 106 may include a front surface 144 corresponding to the front surface 142. In some examples, the front surfaces 142, 144 may be substantially perpendicular to the respective inner surfaces 108, 110 of the first and second walls 104, 106. Additionally, at least one of the front surfaces 142, 144 may be disposed proximate the front 134 of the cabinet 102 and may form at least a portion of the cabinet 102 with which the filter 130 and/or other portions of the door 128 may mate when the cabinet 102 is in the closed condition. In some examples, at least one of the shelves 138 may be connected to and/or otherwise supported by at least one of the front surfaces 142, 144.

In some examples, the cabinet 102 may also include a flow plate 146. The flow plate 146 may be connected to and/or otherwise supported by at least one of the front surfaces 142, 144. Additionally and/or alternatively, the flow plate 146 may be connected to and/or otherwise supported by at least one of the inner surfaces 108, 110, 126. As noted above, the flow plate 146 may comprise a partition of the present disclosure. For example, the flow plate 146 may be disposed at least partially within the inner space 112 of the cabinet 102. The flow plate 146 may include a top surface 148 and a front panel 149. The top surface 148 and/or the flow plate 146 may extend substantially and/or entirely from the first wall 104 to the second wall 106. For example, the top surface 148 of the flow plate 146 may be substantially planar, and may be disposed substantially perpendicular to at least one of the first and second walls 104, 106 as well as the back wall 124. The top surface 148 may also be disposed substantially perpendicular to at least one of the inner surfaces 108, 110, 126. For example, the top surface 148 may extend substantially horizontally along the x-axis and/or along the z-axis shown in FIG. 1. Additionally, the top surface 148 may be disposed substantially parallel to the top 114 and/or the inner surface 116 thereof. As will be described in greater detail below, the flow plate 146 may also include a back surface forming a substantially fluid-tight seal with the back wall 124. Further, the top surface 148 may be disposed opposite a bottom surface of the flow plate 146 (FIG. 2A), and the flow plate 146 may partition the inner space 112 of the cabinet 102 into a first portion at least partially defined by the top surface 148 of the flow plate 146 and a second portion at least partially defined by the bottom surface of the flow plate 146.

With continued reference to FIG. 1, in some examples the front panel 149 may be connected to and/or otherwise supported by at least one of the front surfaces 142, 144. In such examples, the flow plate 146 may be connected to at least one of the first wall 104 and the second wall 106 via a connection between the front panel 149 and at least one of the respective front surfaces 142, 144. In this way, the flow plate 146 may be cantilevered from at least one of the front surfaces 142, 144 toward the inner surface 126 of the back wall 124. Further, in some examples the flow plate 146 may be positioned as close to the bottom-most shelf 138A as possible in order to maximize the cooling efficiency of the cabinet 102. For example, the flow plate 146 may be mounted to at least one of the first wall 104 and the second wall 106 such that the top surface 148 of the flow plate 146 is disposed proximate, adjacent to, and/or at least partially abutting a bottom surface 150A of the shelf 138A. Each of the shelves 138 may include a respective bottom surface 150A, 150B, 150C . . . 150N (collectively referred to herein as "bottom surfaces 150"), and the bottom surfaces 150 of the shelves 138 may be spaced from, for example, respective top surfaces 152A, 152B, 152C . . . 152N (collectively referred to herein as "top surfaces 152") of the electrical components 140 disposed thereunder.

In example embodiments, the system 100 may also include a flow device 154 fluidly connected to the cabinet 102 and configured to remove air and/or other fluids from at least a portion of the inner space 112, such as in the direction of arrow 156. For example, in embodiments in which the flow plate 146, one or more of the shelves 138, and/or other structures or partitions of the cabinet 102 partition the inner space 112 into two or more portions, the flow device 154 may be configured to remove air from at least one of the portions without removing air from at least one of the remaining portions. In example embodiments, the flow device 154 may comprise at least one fan, impeller, pump, and/or other device configured to impart movement to a fluid. For example, the flow device 154 may comprise one or more fans configured to apply a vacuum and/or other negative pressure to at least a portion of the inner space 112. The fluid connection between the flow device 154 and, for example, the inner space 112 of the cabinet 102 may be formed via one or more thru holes, orifices, and/or other like passages formed in at least one of the top 114, the back wall 124, the first wall 104, and the second wall 106. Although FIG. 1 illustrates the flow device 154 being connected to the outer surface 118 of the top 114, in additional examples, the flow device 154 may be fluidly connected to the cabinet 102 and/or to the inner space 112 via at least one of the back wall 124, the first wall 104, and the second wall 106 to facilitate the removal of air and/or other fluids from the inner space 112.

In example embodiments in which the cabinet 102 is in the closed condition, the flow device 154 may direct a negative pressure to, for example, the first portion of the inner space 112 at least partially defined by the top surface 148 of the flow plate 146. In such examples, air and/or other fluids may enter the first portion of the inner space 112, via the door 128 and/or the filter 130, substantially in the direction of the z-axis, such as in the direction illustrated by arrows 158A, 158B, 158C . . . 158 N (collectively referred to herein as "arrows 158"). In such examples, air entering the first portion of the inner space 112 in the direction of arrows 158 may pass along and/or substantially parallel to at least one of the top surfaces 152 of the electrical components 140 and/or at least one of the bottom surfaces 150 of the shelves 138. In this way, air traveling in the direction of arrows 158 may pass along and/or between the electrical components 140 in order to facilitate and/or otherwise assist in removing heat therefrom during operation. Removing heat from the electrical components 140 in this way may assist in maintaining a temperature within the cabinet 102 within a desired operating temperature range of the various electrical components 140 disposed therein. For example, removing air from the first portion of the inner space 112 in this way may maintain a temperature within at least the first portion of the inner space 112 between approximately 40° C. and approximately 50° C. In further examples, removing air from the first portion of the inner space 112 in this way may maintain a temperature within at least the first portion of the inner space 112 between approximately 40° C. and approximately 45° C.

Additionally, in some examples at least one of the electrical components 140 may have a width in the direction of the x-axis that is less than a distance, along the x-axis, between the inner surface 108 of the first wall 104 and the inner surface 110 of the second wall 106. In such examples, air removed from the inner space 112 by the flow device 154 may pass along and/or substantially parallel to first and second sides 160, 162 of such an electrical component 140A. For example, air entering the first portion of the inner space 112 in the direction of arrows 164A, 164B (collectively referred to herein as "arrows 164") may pass between the first side 160 and the inner surface 108 and/or between the second side 162 and the inner surface 110 in order to facilitate and/or otherwise assist in removing heat from the electrical component 140A during operation. Removing heat from the electrical components 140 in this way may further assist in maintaining a temperature within the cabinet 102 within a desired operating temperature range of the various electrical components 140 disposed therein.

Figure 2A:
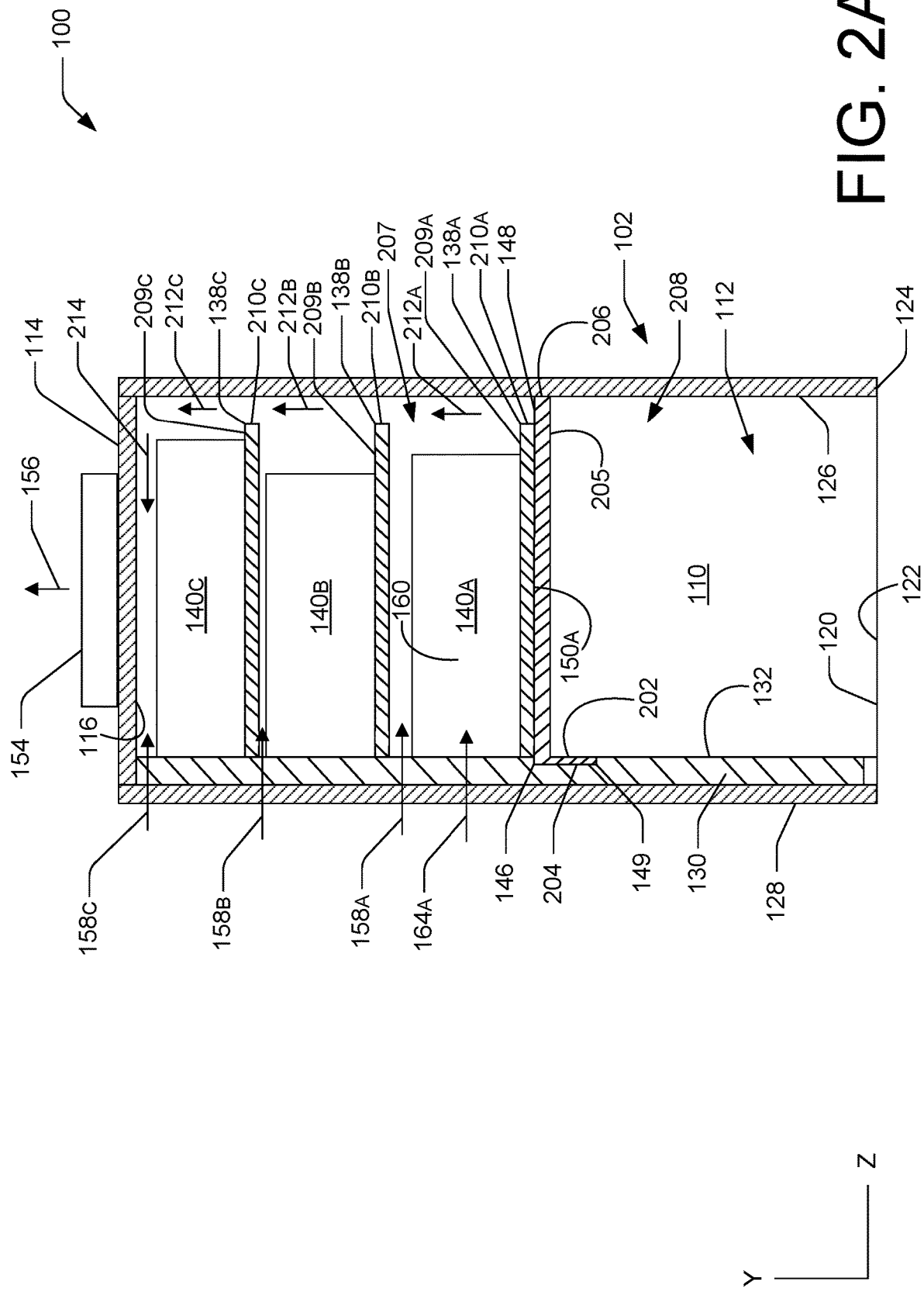
FIG. 2A illustrates an example cross-sectional view of the cabinet shown in FIG. 1.

FIG. 2A illustrates a partial cross-sectional view of the cabinet 102 shown in FIG. 1, taken along the line 2A-2A shown in FIG. 1. The cross-sectional view of the cabinet 102 shown in FIG. 2A illustrates various components of the system 100 and/or flow directions within the cabinet 102 in further detail. For example, the flow plate 146 may include a back surface 202 disposed opposite, facing, and/or substantially parallel to the inner surface 126 of the back wall 124. In example embodiments, at least a portion of the back surface 202 may be formed by the front panel 149 and may comprise, for example, a back surface of the front panel 149. Additionally, the back surface 202 may be disposed opposite, facing, and/or substantially parallel to at least one of the front surfaces 142, 144 described above with respect to FIG. 1. In such examples, the back surface 202 of the front panel 149 may be connected to at least one of the front surfaces 142, 144 so as to secure the flow plate 146 at least partially within the inner space 112. In example embodiments, one or more bolts, screws, weldments, adhesives, and/or other such connection devices may be utilized to connect the back surface 202 to at least one of the front surfaces 142, 144.

The flow plate 146 may also include a front surface 204 disposed opposite the back surface 202. In example embodiments, at least a portion of the front surface 204 may be formed by the front panel 149 and may comprise, for example, a front surface of the front panel 149. Similar to the back surface 202, the front surface 204 may be disposed substantially parallel to at least one of the front surfaces 142, 144 described above with respect to FIG. 1. In particular, the front surface 204 may be configured to mate with at least part of the door 128 when the cabinet 102 is in the closed condition. FIG. 2A illustrates an example closed condition of the cabinet 102. In such an example, at least part of the filter 130, such as at least part of the inner surface 132 of the filter 130 may mate with and/or may otherwise form a substantially fluid-tight seal with the front surface 204. Is understood that at least a portion of the filter 130 may abut, substantially surround, and/or otherwise mate with the front surface 204 in order to form such a substantially fluid-tight seal therewith. One or more gaskets, O-rings, or other such sealing devices may also be provided between the front surface 204 and the inner surface 132 in order to assist in forming such a seal. The inner surface of the door 128 and/or of the filter 130 may also may mate with and/or may otherwise form a substantially fluid-tight seal with the front surfaces 142, 144, and one or more gaskets, O-rings, or other such sealing devices may also be provided between the front surfaces 142, 144 and the inner surface of the door 128 in order to assist in forming such a seal.

In example embodiments, the flow plate 146 may further include a bottom surface 205 disposed opposite and/or substantially parallel to the top surface 148 described above with respect to FIG. 1. The bottom surface 205 may comprise a substantially planar surface of the flow plate 146. In such examples, the bottom surface 205 may extend substantially parallel to and/or otherwise substantially within at least one of the z-axis and the x-axis. Accordingly, similar to the top surface 148, the bottom surface 205 of the flow plate 146 may extend substantially perpendicular to at least one of the back wall 124, the first wall 104, and the second wall 106. The bottom surface 205 may also extend substantially parallel to the inner surface 116 of the top 114 and/or the inner surface 122 of the base 120 (FIG. 1).

With continued reference to FIG. 2A, the flow plate 146 may also include a back surface 206 disposed opposite, facing, and/or substantially parallel to the inner surface 126 of the back wall 124. For example, the back surface 206 of the flow plate 146 may form a substantially fluid-tight seal with at least part of the inner surface 126 when the flow plate 146 is disposed at least partially within the inner space 112. As noted above with respect to the front surface 204, at least part of the back surface 206 may abut, may be disposed substantially adjacent and/or substantially against, and/or may otherwise mate with the inner surface 126 in order to form such a substantially fluid-tight seal therewith. One or more gaskets, O-rings, caulking, weldments, or other such sealing devices may also be provided between the back surface 206 and the inner surface 126 in order to assist in forming such a seal.

As shown in FIG. 2A, the flow plate 146 may partition the inner space 112 into a first portion 207 at least partially defined by the top surface 148 of the flow plate 146, and a second portion 208 at least partially defined by the bottom surface 205 of the flow plate 146. It is understood that the first portion 207 of the inner space 112 may also be at least partially defined by one or more of the inner surfaces 126, 108, 110, 132, and 116. Likewise, the second portion 208 of the inner space 112 may also be at least partially defined by one or more of the inner surfaces 126, 108, 110, 132, and 122. In such examples, the bottom surface 205 may form at least part of an upper region of the second portion 208 while the top surface 148 may form at least part of a lower region of the first portion 207. When the cabinet is in the closed condition, such as the example closed condition illustrated in FIG. 2A, the various surfaces noted above defining the first and second portions 207, 208 of the inner space 112 may substantially enclose the respective first and second portions 207, 208 within the cabinet 102. Further, due to the substantially fluid-tight seals formed between the flow plate 146 and, for example, the inner surfaces 126, 132, 108, 110 described above the flow plate 146 and/or other partitions of the present disclosure may substantially fluidly separate the first portion 207 of the inner space 112 from the second portion 208 when the cabinet 102 is in the closed condition.

As further illustrated in FIG. 2A, each of the shelves 138 may include a respective top surface 209A, 209B, 209C . . . 209N (collectively referred to herein as "top surfaces 209") and a respective back surface 210A, 201B, 210C . . . 210N (collectively referred to herein as "back surfaces 210"). The top surfaces 209 of the shelves 138 may be substantially planar surfaces disposed substantially parallel to at least one of the inner surface 122 and the inner surface 116. Further, one or more electrical components 140 may be disposed on each of the top surfaces 209, and supported thereby within the cabinet 102.

The back surfaces 210 of the shelves 138 may each extend substantially perpendicular to the respective top surfaces 209 and bottom surfaces 150 of the corresponding shelves 138. Additionally, the back surfaces 210 of the shelves 138 may extend substantially parallel to the inner surface 126 of the back wall 124. Accordingly, in some examples, air or other fluids traveling within the inner space 112 of the cabinet 102 in a direction substantially parallel to the inner surface 126 of the back wall 124 may pass between the inner surface 126 and a respective back surface 210A, 201B, 210C . . . 210N of at least one of the shelves 138. Such a direction of airflow is depicted by one or more of the arrows 212A, 212B, 212C (collectively referred to herein as "arrows 212").

For example, as noted above the door 128 of the cabinet 102 may include a filter 130. The door 128 and the filter 130 may include holes, orifices, and/or other like channels permitting the passage of air from outside of the cabinet 102 to at least the first portion 207 of the inner space 112 when the cabinet 102 is in a closed position. Such air may be drawn from outside of the cabinet 102 into the first portion 207 via the door 128 and/or the filter 130 as a result of the flow device 154 being operated to direct a vacuum and/or other negative pressure to at least the first portion 207. The substantially fluid-tight seals formed by contact and/or other sealing devices between the flow plate 146 and the inner surfaces 132, 126, 108, 110 may substantially prohibit the flow of air and/or other fluids from the second portion 208 of the inner space 112 into the first portion 207.

As illustrated by arrows 158, 164, air entering the first portion 207 may flow between one or more of the electrical components 140 in a direction substantially parallel to and/or in a path substantially along the top surfaces 209 of the shelves 138. The air entering the first portion 207 may also flow in a direction substantially parallel to and/or in a path substantially along the top surfaces 152 of the electrical components 140. Additionally or alternatively, the air entering the first portion 207 may flow in a direction substantially parallel to and/or in a path substantially along at least one of the sides 160, 162 of at least one of the electrical components 140. In such examples, the top surface 148 of the flow plate 146 may direct the air passing from outside of the cabinet 102 to the first portion 207 of the inner surface 112, via the door 128 and/or the filter 130, to travel in a direction substantially parallel to and/or in a path substantially along at least a portion of the top surface 148 from the back surfaces 210 of the shelves 138 to the inner surface 126 of the back wall 124. For example, such air may flow in a direction substantially parallel to and/or in a path substantially along at least a portion of the top surface 148 proximate the back surface 210A of the shelf 138A. Such a portion of the top surface 148 may extend between, for example, a first location proximate and/or substantially adjacent to the back surface 210A to a second location proximate and/or substantially adjacent to the inner surface 126 of the back wall 124.

Upon reaching the inner surface 126 of the back wall 124, the inner surface 126 and/or the top surface 148 may direct such air to travel in a direction substantially parallel to and/or in a path substantially along the inner surface 126 of the back wall 124. The contact and/or the substantially fluid-tight seal between the back surface 206 of the flow plate 146 and the inner surface 126 of the back wall 124 may direct such air to travel in, for example, the direction of arrows 212 (e.g., in a direction substantially parallel to and/or in a path substantially along the inner surface 126). Once such air reaches the inner surface 116 of the top 114, the inner surface 116 may direct such air to travel in, for example, a direction substantially parallel to and/or in a path substantially along the inner surface 116. Such a direction is depicted in FIG. 2A by arrow 214.

Figure 2B:
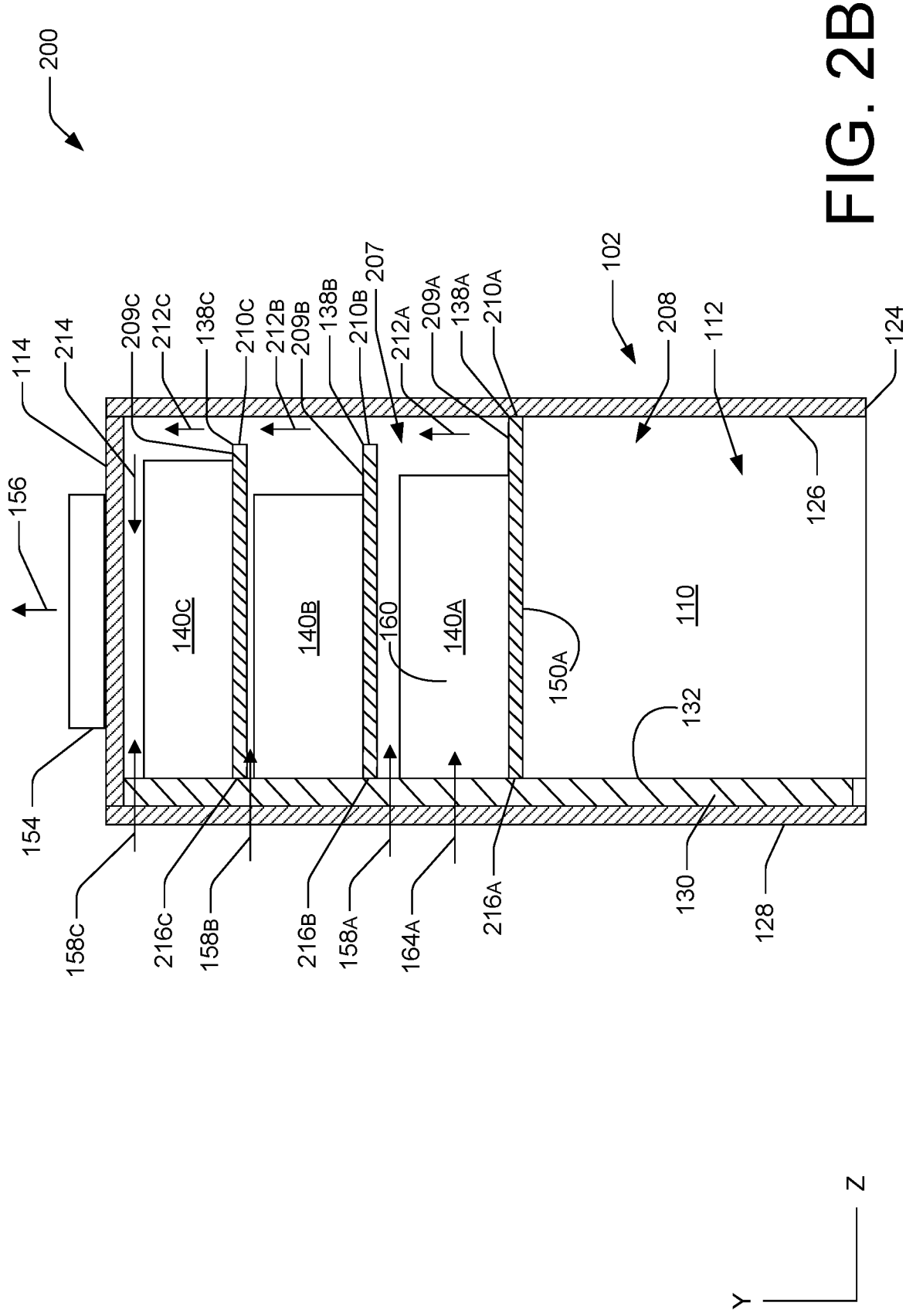
FIG. 2B illustrates a cross-sectional view of a cabinet included in another example system of the present disclosure.

FIG. 2B illustrates another example system 200 of the present disclosure. The system 200 may be substantially identical to the system 100 described herein. In system 200, however, the flow plate 146 may be omitted. Additionally, the shelf 138A may extend from the inner surface 132 of the filter 130 to the inner surface 126 of the back wall 24. In such examples, a front surface 216A of the shelf 138A may form a substantially fluid-tight seal with the inner surface 132 of the filter 130. Additionally, the back surface 210A of the shelf 138A may form a substantially fluid-tight seal with the inner surface 126 of the back wall 124. Although not illustrated in FIG. 2B, in such examples respective sidewalls of the shelf 138A may also form substantially fluid-tight seals with the inner surfaces 108, 110 of the first and second walls 104, 106. In this way, the shelf 138A may comprise a partition of the system 200. Thus, the shelf 138A may be disposed at least partially within the inner space 112, and may partition the inner space 112 into a first portion 207 at least partially defined by the top surface 209A of the shelf 138A, and a second portion 208 at least partially defined by the bottom surface 150A of the shelf 138A. At least part of one or more of the back surface 210A, the front surface 216A, and the side surfaces of the shelf 138A may abut, may be disposed substantially adjacent and/or substantially against, and/or otherwise mate with a corresponding one of the inner surfaces 126, 132, 108, 110 in order to form such a substantially fluid-tight seal therewith. One or more gaskets, O-rings, caulking, weldments, or other such sealing devices may also be provided between such surfaces in order to assist in forming such a seal. Such a fluid-tight seal may also be formed between, for example, the front surfaces 216B, 216C of the shelves 138B, 138C, and the inner surface 132 of the filter 130.

Example Flow Plate

FIG. 3 illustrates an isometric view of an example flow plate 146 of the present disclosure. As noted above, the flow plate 146 may include, among other things, a front panel 149 forming a front surface 204 of the flow plate 146. The front panel 149 may also include first and second side surfaces 302, 304 substantially perpendicular to the front surface 204. The front panel 149 may also include the back surface 202 described above. Additionally, the front panel 149 may include one or more thru holes or other like connection structures configured to assist in connecting the front panel 149 to one or more structures of the cabinet 102 such as, for example, at least one of the front surfaces 142, 144 (FIG. 1). For example, the front panel may include first and second thru holes 306, 308 extending from the front surface 204 to the back surface 202 in order to facilitate a connection between the front panel 149 and at least one of the front surfaces 142, 144. In some examples, at least one of the thru holes 306, 308 may be threaded and/or otherwise configured to accept a corresponding screw, bolt, dowell, hook, and/or other like connection device. Alternatively, in example embodiments in which the front panel 149 and/or other portions of the flow plate 146 are connected to the cabinet 102 via one or more weldments, clamps, or other like connection devices, one or more of the thru holes 306, 308 may be omitted.

Additionally, as noted above the flow plate 146 may include one or more outer surfaces forming a substantially fluid-tight seal with one or more corresponding inner surfaces of the cabinet 102. For example, the flow plate 146 may include a first side panel 310, and a second side panel 312 disposed opposite and/or substantially parallel to the first side panel 310. In some examples, the first and second side panels 310, 312 may extend substantially perpendicular to the top surface 148 of the flow panel 146. Although FIG. 3 illustrates the first and second side panels 310, 312 extending substantially perpendicular to the top surface 148 in a downward direction defined by the y-axis, similar to the front panel 149. In a further example, however, at least one of the first and second side panels 310, 312 may extend substantially perpendicular to the top surface 148 in an upward direction defined by the y-axis.

Additionally, the first side panel 310 may include a first outer surface 314, and the second side panel 312 may include a second outer surface 316. Thus, the first outer surface 314 of the flow plate 146 may be formed by the first side panel 310, and the second outer surface 316 of the flow plate 146 may be formed by the second side panel 312. In such examples, the outer surfaces 314, 316 may comprise substantially planar surfaces extending substantially perpendicular to the front surface 204 of the front panel 149. In such examples, the outer surface 314 may be substantially parallel to the outer surface 316, and the outer surfaces 314, 316 may be configured to form substantially fluid-tight seals with the inner surfaces 108, 110, respectively.

Further, in some examples the flow plate 146 may also include a back panel 318. The back panel 318 may extend substantially parallel to the front panel 149, and may extend substantially perpendicular to at least one of the first and second side panels 310, 312. In some examples, the back panel 318 may extend substantially perpendicular to the top surface 148 of the flow panel 146. Although FIG. 3 illustrates the back panel 318 extending substantially perpendicular to the top surface 148 in a downward direction defined by the y-axis, similar to the front panel 149, in a further example the back panel 318 may extend substantially perpendicular to the top surface 148 in an upward direction defined by the y-axis.

Additionally, the back panel 318 may include a back surface. In such examples, the back surface of the back panel 318 may comprise the back surface 206 of the flow plate 146. Thus, the back surface 206 may be formed by the back panel 318. In such examples, the back surface 206 may comprise a substantially planar surface extending substantially parallel to the front surface 204 of the front panel 149. In such examples, the back surface 206 may be substantially perpendicular to the outer surfaces 314, 316, and the back surface 206 may be configured to form substantially fluid-tight seals with the inner surface 126 of the back wall 124 (FIG. 1).

FIGS. 4-6 illustrate a front view, a top view, and a side view, respectively, of the flow plate 146. It is understood that at least one of the front panel 149, the side panels 310, 312, and the back panel 318 of the flow plate 146 may be formed by bending, cutting, and/or otherwise manipulating at least a portion of a substantially planar sheet of material. Additionally and/or alternatively, at least one of the front panel 149, the side panels 310, 312, and the back panel 318 of the flow plate 146 may be fixedly connected to the top surface 148 and/or other components of the flow plate 146 via weldments, soldering, fusing, forging, casting, milling, and/or other processes. Further, as shown in at least FIG. 4, in some examples the front panel 149 may include a first end 502 and a second end 504 opposite the first end 502. The first and second ends 502, 504 may extend, in the direction of the x-axis, away from the first and second side panels 310, 312. For example, the first and second ends 502, 504 of the front panel 149 may comprise tabs, extensions, or other like structures of the front panel 149 configured to assist in connecting the front panel 149 to the front surfaces 142, 144 and/or other components of the cabinet 102. As shown in at least FIG. 4, in some examples the first thru hole 306 may be formed proximate and/or substantially within the first end 502, and the second thru hole 308 may be formed proximate and/or substantially within the second end 504.

Example Network

Figure 7:
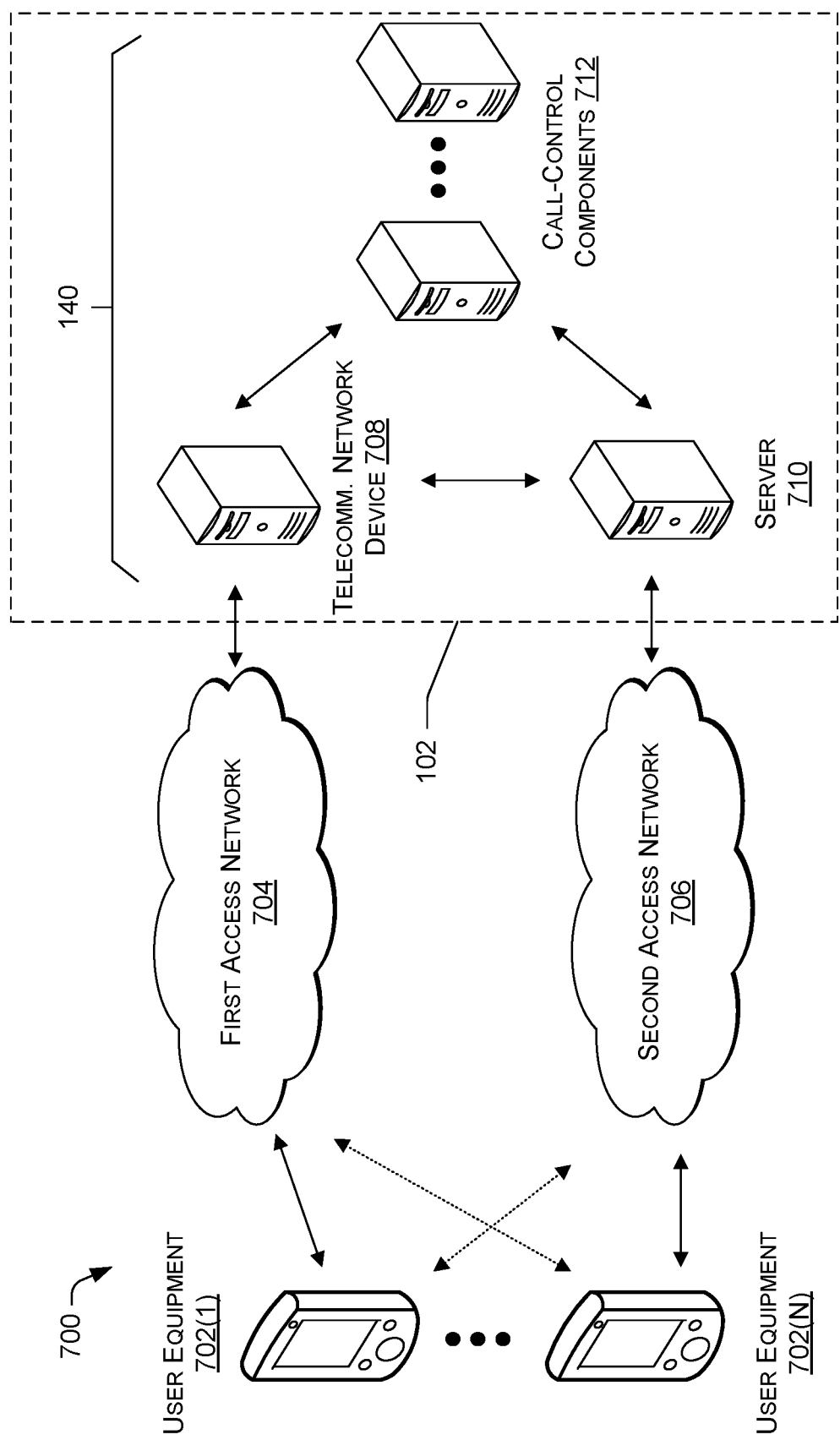
FIG. 7 illustrates an example telecommunications network including electrical components that may be stored in an example cabinet of the present disclosure.

FIG. 7 illustrates an example telecommunications network 700 and shows an overview of devices involved in providing call, radio, communications, internet, network, and/or other services to user equipment. As shown in FIG. 7, such networks 700 may include one or more of the electrical components 140 described herein. Additionally, such networks 100 may include one or more of the cabinets 102 describe herein to store such electrical components 140.

The telecommunications network 700 includes user equipment (UE) 702(1)-702(N) (individually or collectively referred to herein as "UE 702"). The UE 702 may be or include any sort of device capable of cellular, radio, and/or wireless network communication, such as a cellular phone, a tablet computer, a personal digital assistant (PDA), a personal computer (PC), a laptop computer, a media center, a work station, etc. In some embodiments, the UE 702 may have a radio and may be configured to tune that radio to licensed wireless spectrum utilized by packet-switched access networks, such as LTE access networks. UE 702 may also be configured to tune the radio to wireless spectrum utilized by circuit-switched access networks, such as GSM access networks or UMTS access networks. UE 702 may also be configured to tune the radio to wireless spectrum utilized by local-area network (LAN) (or personal-area network, PAN, and likewise throughout) access networks, such as WIFI networks. When equipped with a single radio, UE 702 may only be connected to one of these access networks at a time.

In some examples, UE 702 can communicate, e.g., via a first access network 704 of a first type or a second access network 706 of a second, different type. The first type may be a packet-switched (PS) type (e.g., LTE) and the second type may be a circuit-switched (CS) type (e.g., GSM). UE 702 may participate in a handover between first access network 704 and second access network 706, e.g., as a user moves in and out of coverage areas of individual access networks 704 or 706.

In some examples, the first access network 704 or the second access network 706 may be any sort of access network, such as a GSM or UMTS network; a universal terrestrial radio network (UTRAN) or an Enhanced Data rates for GSM Evolution (EDGE) radio access network (GERAN); an evolved universal terrestrial radio access network (E-UTRAN), a WIFI (IEEE 802.11) or other LAN access network; or a satellite or terrestrial wide-area access network such as a wireless microwave access (WIMAX) network. In some examples, the first access network 704 or the second access network 706 may include a base station (a "NodeB"), as well as a radio network controller (RNC).

In some examples, wired access networks may be used, exclusively or in combination with wireless access networks. Examples include Plain Old Telephone Service, POTS, or Public Switched Telephone Network, PSTN, lines, optical (e.g., Synchronous Optical NETwork, SONET) technologies, Asynchronous Transfer Mode (ATM), and other network technologies, e.g., configured to transport Internet Protocol (IP) packets. In some examples, the telecommunications network 700 can include or be communicatively connected with an interworking function (IWF) or other device bridging networks, e.g., LTE, 3G, and POTS networks. In some examples, the IWF can bridge Signaling System 7 (SS7) traffic from the PSTN into the telecommunications network 700, e.g., permitting PSTN customers to place calls to cellular customers and vice versa.

In the illustrated example, UE 702 can communicate via first access network 704 with a telecommunications network device 708 (e.g., mobility management entity, MME), or via second access network 706 with a server 710. In some embodiments, the server 710 may be or include a mobile switching center (MSC) server (MSS) associated with the second access network 706, e.g., a CS access network. The telecommunications network device 708 and the server 710 are examples of access devices that can control or modify communications with UE 702 via access network(s) 704 or 706.

In some examples, the UE 702 may initiate a communication session using a connection to the first access network 704. The first access network 704 may connect the UE 702 to a telecommunications network. A routing device of the first access network 704 may communicate with a device of the telecommunications network 700, such as the telecommunications network device 708.

The telecommunications network device 708 may include a routing device, a combiner, a radio transmitter, a DUW, and/or a gateway device. In some examples, a gateway device may include an Evolved Packet Data Gateway (ePDG). Further, the telecommunications network device 708, as well as the server 710 and the call-control components 712, may each be or include a server or server farm, multiple, distributed server farms, a mainframe, a work station, a personal computer (PC), a laptop computer, a tablet computer, an embedded system, or any other sort of device or devices. In one implementation, one or more of telecommunications network device 708, the server 710, and the call-control components 712 may represent a plurality of computing devices working in communication, such as a cloud computing network of nodes. Also, the telecommunications network device 708, the server 710, and the call-control components 712 may each be or include devices of a telecommunications network. In various embodiments, the call-control components 712 represent components of an IMS of the telecommunications network.

Throughout this disclosure, other devices can be used in conjunction with listed devices. For example, a telecommunications network can include many core network devices, only some of which implement functions described herein. Similarly, a telecommunications network can include many anchoring network devices, only some of which implement functions described herein. Further, any of the devices described herein with respect to the network 700 may comprise, among other things, electrical components 140 configured to be stored within one or more cabinets 102 of the present disclosure.

Example Method

Figure 8:
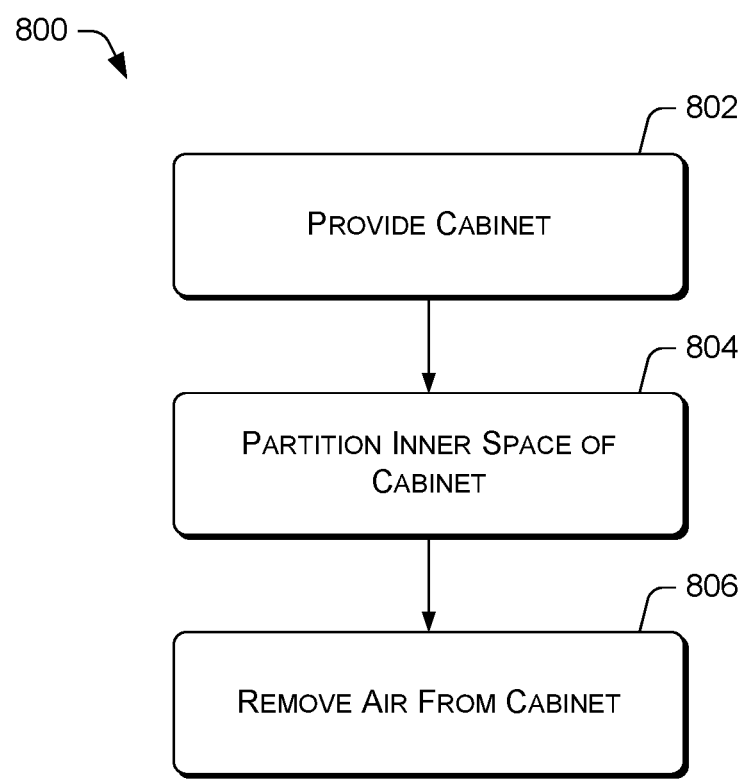
FIG. 8 depicts a flowchart illustrating an example method of the present disclosure.

FIG. 8 depicts a flowchart 800 illustrating an example method of the present disclosure. Each operation of the flowchart 800 represents one or more operations that can be implemented in hardware, software, or a combination thereof. The order in which the operations are described is not intended to be construed as a limitation, and any number of the described operations can be combined in any order and/or in parallel to implement the processes.

As shown in FIG. 8, an example method of the present disclosure may include providing a cabinet 102 at step: 802. As noted above, an example cabinet 102 of the present disclosure may include, among other things, a first wall 104, a second wall 106 opposite the first wall 104, and a back wall 124 extending from the first wall 104 to the second wall 106. In such examples, the back wall 124 may have an inner surface 126 forming at least part of an inner space 112 of the cabinet 102. Additionally, in some examples the inner space 112 may be substantially enclosed by at least part of the first wall 104, the second wall 106, and the back wall 124. For example, at least part of the first and second walls 104, 106, and the back wall 124 may substantially enclose the inner space 112 when the cabinet 102 is in a closed condition.

At step: 804, the method may also include partitioning the inner space 112 of the cabinet 102 using one or more partitions of the present disclosure. For example, at step: 804 the method may include connecting a partition, such as a flow plate 146, a shelf 138, and/or any other similar partition to the cabinet 102 such that the partition forms a substantially fluid-tight seal with the first wall 104, the second wall 106, and the back wall 124. For example, the partition may form such a substantially fluid-tight seal with at least one of the inner surfaces 108, 110, 126, when the partition is disposed at least partially within the inner space 112. The partition may include a top surface and a bottom surface opposite the top surface. Additionally, the partition may separate and/or otherwise partition, the inner space 112 into a first portion 207 at least partially defined by the top surface of the partition, and a second portion 208 at least partially defined by the bottom surface of the partition. As noted above, in some examples, the partition connected to the cabinet 102 at step: 804 may comprise the flow plate 146. In such examples, the top and bottom surfaces utilized in partitioning the inner space 112 of the cabinet 102 may comprise the top surface 148 and the bottom surface 205 of the flow plate 146. Alternatively, the partition connected to the cabinet 102 at step: 804 may comprise at least one of the shelves 138. In such examples, the top and bottom surfaces utilized in partitioning the inner space 112 may comprise a top surface 209 and a bottom surface 150 of at least one of the shelves 138.

At step: 806, the method may also include removing air from the cabinet 102. For example, at step: 806 the method may include removing air from the first portion 207 using the flow device 154 fluidly connected to the cabinet 102 and/or to the inner space 112. Such air may be removed from the first portion 207 while the cabinet 102 is in the closed condition. Additionally, in such examples, the partition may substantially prohibit removal of air by the flow device 154 from the second portion 208 via the first portion 207.

At step: 806, the top surface 148 of the flow plate 146 may direct the air passing from outside of the cabinet 102 to the first portion 207 of the inner surface 112 to travel in a direction substantially parallel to and/or in a path substantially along at least a portion of the top surface 148 from the back surfaces 210 of the shelves 138 to the inner surface 126 of the back wall 124. For example, such air may flow in a direction substantially parallel to and/or in a path substantially along at least a portion of the top surface 148 proximate the back surface 210A of the shelf 138A. In some examples, removing air from the first portion 207 of the cabinet 102 at step: 806 may also include directing air, at least partially with the top surface of the partition, to travel in a direction substantially parallel to the inner surface 126 of the back wall 124. Such a direction may be illustrated by, for example, the arrows 212 shown in FIGS. 2A and 2B. In some examples, removing air from the first portion 207 in this way may maintain a temperature within the first portion 207 between approximately 40° C. and approximately 50° C. For example, such a temperature may be maintained between approximately 40° C. and approximately 45° C.

Although not expressly shown in FIG. 8, in some examples, such a method may also include connecting a door 128 to the cabinet 102 opposite the back wall 124. For example, the door 128 may be rigidly, rotatably, removably, and/or otherwise connected to at least one of the first and second walls 104:06 to facilitate transitioning the cabinet 102 between the closed condition and an open condition exposing at least a portion of the inner space 112. For example, the door 128 may be configured to mate with the first wall 104 and the second wall 106, when the cabinet 102 is in the closed condition. The door 128 may also be configured to expose at least a portion of the inner space 112 when the cabinet 102 is in the open condition. Additionally, the door 128 may permit air, and/or other fluids to pass from outside of the cabinet 102, when the cabinet 102 is in the closed condition, to at least the first portion 207 of the inner space 112. In some examples, the door 128 may include one or more holes, openings, channels, vents, and/or other passages through which air may pass from outside of the cabinet 102 to the various portions of the inner space 112. Additionally, the door 128 may include one or more filters 130 forming a substantially fluid-tight seal with, for example, one or more of the shelves 138, the flow plate 146, the respective front surfaces 142, 144 of the first and second walls 104, 106, and/or other components of the cabinet 102, when the cabinet 102 is in the closed condition. Such a filter 130 may comprise, for example, a particulate filter, and may also include one or more holes, openings, channels, and/or other passages through which air may pass from outside of the cabinet 102 to the inner space 112.

Further, although not expressly shown in FIG. 8, in embodiments in which the partition comprises a flow plate 146, an example method of the present disclosure may also include connecting at least one shelf 138 to the first and second walls 104, 106 of the cabinet 102. In such examples, the shelf 138 may include a back surface 210 that is spaced from the inner surface 126 of the back wall 124. In such examples, air traveling in a direction substantially parallel to the inner surface 126 of the back wall 124, such as in the direction of arrows 212 may pass between the inner surface 126 of the back wall 124 and the back surface 210 of the shelf 138. The air may continue in the direction of arrows 212, and may then travel in the direction of arrow 214 upon interfacing with an inner surface 116 of a top 114 of the cabinet 102 extending substantially perpendicular to the first wall 104, the second wall 106, and the back wall 124. The air may exit the cabinet 102 via the top 114, and/or via one or more of the first and second walls 104, 106, and the back wall 124. In example embodiments in which the air exits the cabinet 102 via the top 114, the air may travel in the direction of arrow 156 upon being removed by the flow device 154.

Removing air from the cabinets described herein may assist in maintaining such cabinets within a desired operating temperature range of the various electrical components disposed therein. For example, any of the electrical components described above with respect to the network 700 shown in FIG. 7 may be operated for extended periods of time and, as a result, may generate a significant amount of heat when stored within such cabinets. As a result, it may be necessary to extract heat generated by such electrical components by removing air from the cabinets substantially continuously, at regular intervals, and/or in response to one or more signals from temperature sensors associated with such cabinets and configured to determine a temperature within the inner space of such cabinets.

In particular, by utilizing a flow plate, and/or other like partition to form a first portion of the inner space that is substantially fluidly separated from the second portion of the inner space, such a partition may force substantially all of the air removed by the flow device to be drawn into the first portion of the inner space from outside of the cabinet. Additionally, such a partition may force substantially all of the air entering the first portion of the inner space to pass along at least one surface of each of the electrical components disposed within the first portion of the inner space. Directing the air to travel in this way may maximize the efficiency with which the flow device 154 may extract heat from the electrical devices. In particular, because the partition, forms a substantially fluid-tight seal with each of the inner surfaces of the cabinet, and with the inner surface of the door, substantially no air may be withdrawn from the second portion of the inner space, and/or from other portions of the inner space where resistance to such airflow is relatively low.

Conclusion

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

What is claimed is:

1. A system, comprising:
   a cabinet including a top wall, a first wall, a second wall opposite the first wall, a back wall extending from the first wall to the second wall, and a door, the back wall having an inner surface forming at least part of an inner space of the cabinet substantially enclosed by the top wall, the first wall, the second wall, and the back wall, the door configured to mate with the first wall and the second wall to place the cabinet into a closed condition when the door is in a closed position;
   a flow plate disposed at least partially within the inner space, the flow plate including a top surface, a bottom surface opposite the top surface, a back surface, and a front surface opposite the back surface, the flow plate partitioning the inner space into a first portion at least partially defined by the top surface and a second portion at least partially defined by the bottom surface, the back surface of the flow plate forming a substantially fluid-tight seal with the inner surface;
   a shelf disposed at least partially within the first portion of the inner space, the shelf including a back surface facing the inner surface of the back wall and being spaced from the inner surface, and a bottom surface at least partially abutting the top surface of the flow plate; and
   a flow device fluidly connected to at least one of the top wall, the first wall, the second wall, or the back wall of the cabinet, the flow device configured to draw air from an exterior environment of the cabinet into the first portion of the inner space, draw the air through the first portion of the inner space, and to exhaust the air outside of the cabinet by applying negative pressure to the first portion of the inner space;
   wherein the door includes a filter having an inner surface and the inner surface of the filter is configured to form a substantially fluid-tight seal with the front surface of the flow plate when the cabinet is in the closed condition permitting the air to pass from the exterior environment of the cabinet to the first portion of the inner space, and
   wherein the flow plate is configured to substantially prohibit removal of the air by the flow device from the second portion, via the first portion, when the cabinet is in the closed condition and to substantially prohibit the air from passing between the shelf and one or more of the first wall, the second wall, and the back wall.

2. The system of claim 1, wherein the back surface of the flow plate is formed by a back panel of the flow plate, the back panel extending substantially perpendicular to the top surface and substantially parallel to the inner surface of the back wall.

3. The system of claim 1, wherein the flow plate includes a first outer surface and a second outer surface opposite the first outer surface, the first outer surface forming a first substantially fluid-tight seal with a first wall inner surface, and the second outer surface forming a second substantially fluid-tight seal with a second wall inner surface opposite the first wall inner surface, wherein the first wall inner surface and the second wall inner surface comprise additional respective parts of the inner space.

4. The system of claim 3, wherein the first outer surface of the flow plate is formed by a first side panel of the flow plate extending substantially perpendicular to the top surface, the second outer surface of the flow plate is formed by a second side panel of the flow plate opposite the first side panel and extending substantially perpendicular to the top surface, and the back surface of the flow plate is formed by a back panel of the flow plate extending substantially perpendicular to the top surface.

5. The system of claim 3, wherein at least one of the first substantially fluid-tight seal and the second substantially fluid-tight seal is formed by contact between the flow plate and a corresponding at least one of the first wall inner surface and the second wall inner surface.

6. The system of claim 1, wherein the door is further configured to at least partially expose the inner space to the exterior environment to place the cabinet into an open condition when the door is at least partially open.

7. The system of claim 6, wherein the front surface of the flow plate is configured to mate with at least part of the filter when the cabinet is in the closed condition.

8. The system of claim 6, wherein the top surface of the flow plate directs the air passing from outside of the cabinet into the first portion, via the filter, to travel from the back surface of the shelf to the inner surface of the back wall.

9. The system of claim 1, wherein the flow plate includes a front panel connected to at least one of the first wall and the second wall, the flow plate being positioned such that the top surface is disposed substantially adjacent to the bottom surface of the shelf, the bottom surface of the shelf extending substantially perpendicular to the back surface of the shelf.

10. A system, comprising:
    a cabinet including a first wall, a second wall opposite the first wall, a back wall extending from the first wall to the second wall, and a top wall connected to the first wall, the second wall, and the back wall, the back wall having an inner surface forming at least part of an inner space of the cabinet substantially enclosed by the first wall, the second wall, the top wall, and the back wall;
    a door configured to mate with at least the first wall and the second wall to place the cabinet into in a closed condition when the door is in a first position and enclose the inner space, the door including at least one fluid passage configured to facilitate passage of at least air into the inner space and a filter having an inner surface;
a partition forming a substantially fluid-tight seal with the first wall, the second wall, the back wall, and the door when the cabinet is in the closed condition, the partition including a top surface, a bottom surface opposite the top surface, and a front surface, the partition partitioning the inner space into a first portion at least partially defined by the top surface and a second portion at least partially defined by the bottom surface;
a flow device fluidly connected to at least one of the top wall, the first wall, the second wall, or the back wall of the cabinet, the flow device configured to draw air from an exterior environment, to draw the air through the at least one fluid passage and the first portion of the inner space, and to exhaust the air outside of the cabinet by applying negative pressure to the first portion of the inner space; and
a first shelf disposed at least partially within the first portion of the inner space, forming a substantially fluid-tight seal with the first wall, the second wall, and the door when the cabinet is in the closed condition, wherein the first shelf is configured to support one or more electrical components and includes a back surface that faces the inner surface of the back wall and is spaced from the inner surface of the back wall,
wherein the front surface of the partition is configured to form a substantially fluid-tight seal directly with the inner surface of the filter when the cabinet is in the closed condition permitting the air to pass from the exterior environment to the first portion of the inner space and substantially prohibit removal of the air by the flow device from the second portion, via the first portion, when the cabinet is in the closed condition.

11. The system of claim 10, wherein the partition comprises a second shelf of the cabinet, the partition being connected to the first and second walls, the top surface extending substantially perpendicular to the first and second walls, and the partition being configured to support at least one additional electrical component.

12. The system of claim 10, wherein the cabinet includes the first shelf extends extending substantially parallel to the partition and is connected to the first and second walls, the back surface of the first shelf being spaced from the inner surface of the back wall, and wherein the inner surface of the back wall directs air being removed from the first portion to travel in a direction substantially parallel to the inner surface of the back wall between the inner surface of the back wall and the back surface of the first shelf.

13. A system, comprising:
a cabinet including a top wall, a first wall, a second wall opposite the first wall, and a back wall extending from the first wall to the second wall, the back wall having an inner surface forming at least part of an inner space of the cabinet substantially enclosed by the top wall, the first wall, the second wall, and the back wall;
a door configured to mate with the first wall, the second wall, and the top wall to place the cabinet into in a closed condition when the door is in a first position, and to expose the inner space to an exterior environment to place the cabinet into an open condition when the door is in a second position, the door having at least one fluid passage with a filter having an inner surface, the at least one fluid passage comprising at least one of a vent, a hole, a channel, an opening, a grate, or an orifice;
a plurality of partitions that form a substantially fluid-tight seal with at least the first wall, the second wall, and the door when the cabinet is in the closed condition, wherein the plurality of partitions comprise:
one or more flow plates each comprised of a top surface, a bottom surface opposite the top surface, a first back surface that extends perpendicular to the top surface and the bottom surface, and a first front surface opposite the first back surface, the first back surface of a flow plate of the one or more flow plates forming a substantially fluid-tight seal with the back wall and partitioning the inner space into a first portion at least partially defined by the top surface of the flow plate of the one or more flow plates and a second portion partially defined by the bottom surface of the flow plate of the one or more flow plates, the first front surface forming a substantially fluid-tight seal with the inner surface of the filter when the cabinet is in the closed condition, and
one or more shelves disposed at least partially within the first portion of the inner space, the one or more shelves each including a second back surface facing the inner surface of the back wall and being spaced from the inner surface of the back wall; and
a flow device fluidly connected to at least one of the top wall, the first wall, the second wall, or the back wall of the cabinet, the flow device configured to draw air from the exterior environment, to draw the air through the fluid passage and the first portion of the inner space, and to exhaust the air outside of the cabinet by applying negative pressure to the first portion of the inner space,
wherein a second bottom surface, associated with a shelf of the one or more shelves, is abutting the top surface of the flow plate.

14. The system of claim 13, wherein the one or more flow plates are further configured to partition the first portion of the inner space into two or more additional portions; and
wherein the flow device is further configured to remove the air from at least one of the two or more additional portions.

15. The system of claim 13, wherein the one or more shelves extend substantially parallel to the one or more flow plates and connect to the first and second walls, the second back surfaces of the one or more shelves spaced from the inner surface of the back wall; and
wherein the inner surface of the back wall directs the air being removed from the first portion to travel in a direction substantially parallel to the inner surface of the back wall between the inner surface of the back wall and the second back surfaces of the one or more shelves.

* * * * *